United States Patent
Mitani et al.

(10) Patent No.: US 10,508,235 B2
(45) Date of Patent: *Dec. 17, 2019

(54) FLUORIDE PHOSPHORS AND LIGHT EMITTING DEVICES USING THE SAME

(71) Applicant: DENKA COMPANY LIMITED, Tokyo (JP)

(72) Inventors: Shunsuke Mitani, Omuta (JP); Masayoshi Ichikawa, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/112,952

(22) Filed: Aug. 27, 2018

(65) Prior Publication Data

US 2019/0062630 A1 Feb. 28, 2019

(30) Foreign Application Priority Data

Aug. 30, 2017 (JP) ................................. 2017-166124

(51) Int. Cl.
*H01L 33/00* (2010.01)
*C09K 11/61* (2006.01)
*H01L 33/50* (2010.01)

(52) U.S. Cl.
CPC .......... *C09K 11/617* (2013.01); *H01L 33/502* (2013.01)

(58) Field of Classification Search
USPC .............................. 257/98, 13, 79–103, 918, 257/E51.018–E51.022, E33.001–E33.077
See application file for complete search history.

(56) References Cited

U.S. PATENT DOCUMENTS

| | | | |
|---|---|---|---|
| 2016/0160122 A1* | 6/2016 | You | C09K 11/617 428/403 |
| 2016/0186053 A1* | 6/2016 | Min | C09K 11/617 252/301.4 F |
| 2017/0009132 A1* | 1/2017 | Park | C09K 11/617 |
| 2018/0282620 A1* | 10/2018 | Ichikawa | C09K 11/616 |
| 2019/0071602 A1* | 3/2019 | Mitani | H01L 33/502 |

FOREIGN PATENT DOCUMENTS

JP 2016204432 A 12/2016

OTHER PUBLICATIONS

Paulusz. (1973). Efficient Mn(IV) emission in fluorine coordination. Journal of the Electrochemical Society, 120(7), 942-947.

* cited by examiner

*Primary Examiner* — Niki H Nguyen
(74) *Attorney, Agent, or Firm* — Caesar Rivise, PC

(57) ABSTRACT

Provided is a fluoride phosphor having a composition represented by the general formula (1):

$$A_2SiF_6:Mn^{4+} \qquad (1)$$

in which A represents at least one alkali metal comprising at least K. The fluoride phosphor has a ratio (A1/A2) of an area (A1) of a spectrum in a range of from 637 eV or more to less than 645 eV in XPS measurement to an area (A2) of a spectrum in a range of from 682.8 eV or more to less than 690 eV in XPS measurement, of 0.0008 to 0.0025.

8 Claims, 4 Drawing Sheets

[FIG. 1]
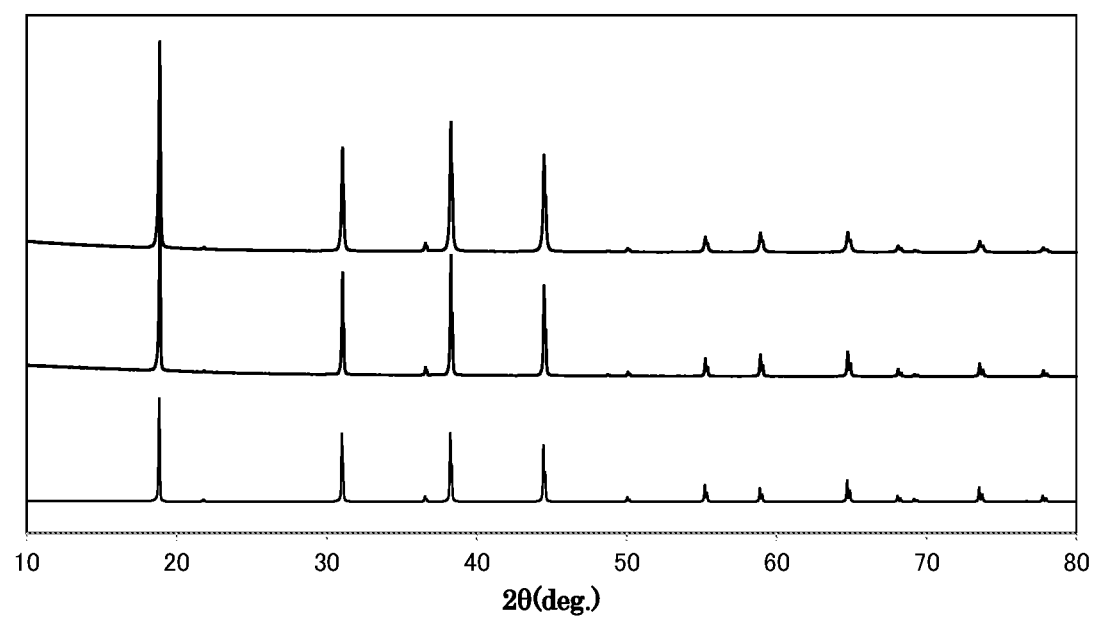

[FIG. 2]
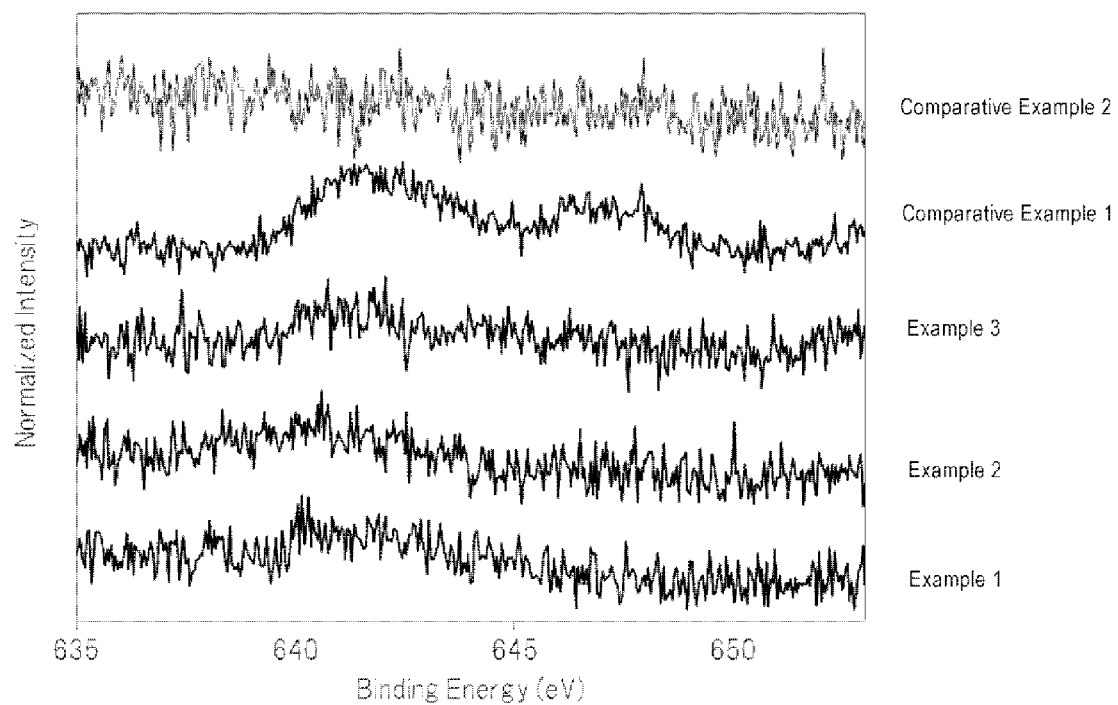

[FIG. 3]
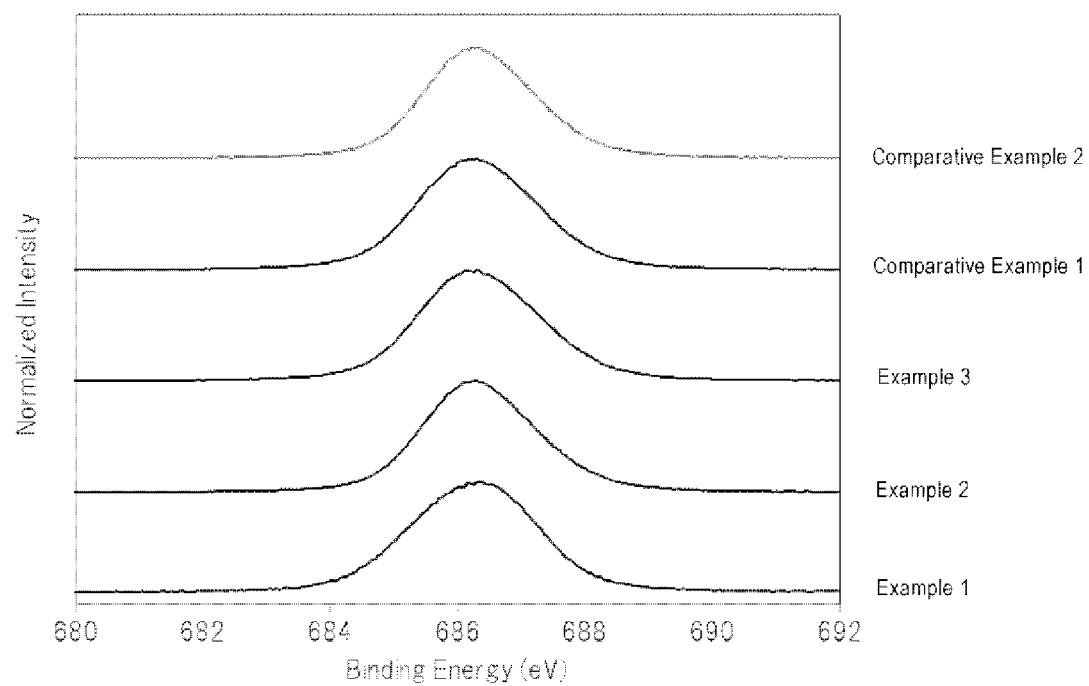

[FIG. 4]
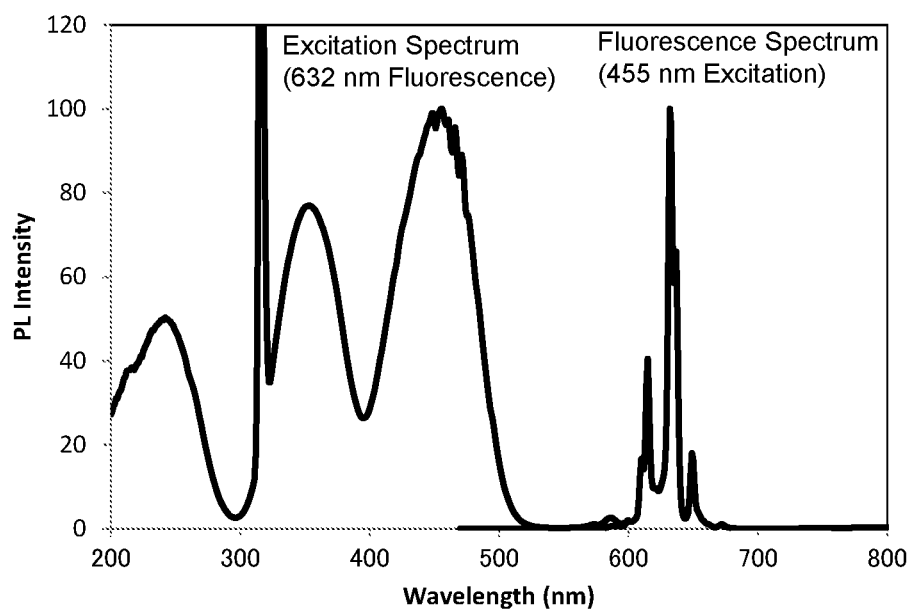

FLUORIDE PHOSPHORS AND LIGHT EMITTING DEVICES USING THE SAME

TECHNICAL FIELD

The present invention relates to fluoride phosphors excited by blue light to emit red light, and light emitting devices using the same.

BACKGROUND ART

Recently, white light emitting diodes (white LEDs) having a combination of a light emitting diode (LED) and a phosphor are employed as white light sources for backlight sources and lighting devices of displays. Among them, white LEDs using InGaN based blue LEDs as light emitting diodes are widely used.

A phosphor used for white LEDs must be efficiently excited by emission of a blue LED to emit fluorescence of visible light. A representative example of such a phosphor includes an yttrium aluminum garnet (YAG) phosphor activated by Ce, which is efficiently excited by blue light to exhibit broad yellow light emission. Combination of a single YAG phosphor with the blue LED can provide light emission in a wide range of visible light together with pseudo white color. Therefore, the white LEDs containing the YAG phosphor are used for lighting and backlight sources.

However, the white LEDs containing the YAG phosphor have a problem that they exhibit both a lower color rendering property for a lighting application and a narrower color reproduction range for a backlight application, because of a lower amount of red components.

Therefore, white LEDs with an improved color rendering property and color reproducibility are developed, which have a combination of a red phosphor that can be excited by a blue LED; a YAG phosphor; and a green phosphor such as β-sialon activated by Eu and orthosilicates. For the red phosphor used for such white LEDs, nitride or oxynitride phosphors having $Eu^{2+}$ as a luminescent center are often used, because the phosphors exhibit a higher fluorescence conversion efficiency, lower luminance reduction at elevated temperature, and good chemical stability. Representative examples of the nitride and oxynitride phosphors include those represented by chemical formulae: $Sr_2Si_5N_8:Eu^{2+}$, $CaAlSiN_3:Eu^{2+}$, and $(Ca,Sr)AlSiN_3:Eu^{2+}$.

However, the red phosphor having $Eu^{2+}$ as a luminescent center has a problem that the red phosphor results in significantly decreased luminance of the white LED as compared with the case of the YAG phosphor alone, despite the red phosphor exhibits a higher fluorescence conversion efficiency, because the red phosphor has a broad emission spectrum and contains many luminescent components with low luminosity factor. Further, the red phosphor used for the display application is also required to have compatibility with color filters, so that the red phosphor having a broad (non-sharp) emission spectrum cannot be necessarily sufficient for the display application.

The red phosphor having a sharp emission spectrum includes red phosphors having $Eu^{3+}$ or $Mn^{4+}$ as a luminescent center. Among them, a fluoride phosphor obtained by dissolving $Mn^{4+}$ in a fluoride crystal such as $K_2SiF_6$ to activate the fluoride crystal is efficiently excited by blue light and exhibits a sharp emission spectrum with a narrow half-width (Non-Patent Document 1). The fluoride phosphor can be used as a red phosphor to achieve an improved color rendering property and improved color reproducibility without lowering the luminance of the white LEDs. Therefore, in recent years, application of the fluoride phosphor to the white LEDs has been frequently studied.

On the other hand, the fluoride phosphor has problems that it has poor durability and the luminescent color changes over time. Therefore, it is proposed that a specific peak area ratio obtained by XPS measurement is controlled to improve the durability (Patent Document 1).

CITATION LIST

Patent Literature

Patent Document 1: Japanese Patent Application Publication No. 2016-204432 A

Non-patent Literature

A. G. PAulusz, "Efficient Mn(IV) Emission in Fluorine Coordination", Journal of The Electrochemical Society, 1973, Vol. 120, No. 7, pp. 942-947

SUMMARY OF INVENTION

Technical Problem

There is always a need for improvement of light emitting properties in light emitting devices such as backlights and lighting of liquid crystal displays. Therefore, improvement of properties is required for each member, and there is thus a need for further improvement of light emitting properties for the phosphors.

However, Patent Document 1 does not sufficiently discuss the light emitting properties of the proposed phosphor, and the proposed phosphor has a problem that it cannot provide sufficient luminance when used for the white LEDs.

The present invention has been made to solve the above problems. An object of the present invention is to provide a fluoride phosphor which exhibits improved light emitting properties and can provide improved luminance when used for the white LEDs.

Another object of the present invention is to provide a light emitting device having improved light emitting properties and improved luminance.

Solution to Problem

The present inventors have conducted extensive studied focusing on fluoride phosphors having $Mn^{4+}$ as a luminescent center and having a sharp emission spectrum, and as a result, the present inventors have found that the light emitting properties as well as luminance when used for the white LEDs can be improved by controlling a specific peak area ratio determined by XPS measurement, and then completed the present invention.

Thus, the present invention provides a fluoride phosphor, the fluoride phosphor having a composition represented by the general formula (1):

$$A_2SiF_6:Mn^{4+} \tag{1}$$

in which A represents at least one alkali metal comprising at least K; and the fluoride phosphor having a ratio (A1/A2) of an area (A1) of a spectrum in a range of from 637 eV or more to less than 645 eV in XPS measurement to an area (A2) of a spectrum in a range of from 682.8 eV or more to less than 690 eV in XPS measurement, of 0.0008 to 0.0025.

Further, the present invention provides a light emitting device comprising: the fluoride phosphor; and a light emitting source having a peak wavelength of 420 nm to 480 nm.

Advantageous Effects of Invention

According to the present invention, it is possible to provide a fluoride phosphor which exhibits improved light emitting properties can provide improved luminance when used for the white LEDs.

Further, according to the present invention, it is possible to provide a light emitting device having improved light emitting properties and improved luminance.

BRIEF DESCRIPTION OF DRAWINGS

FIG. 1 shows X-ray diffraction patterns of fluoride phosphors according to Example 1 and Comparative Example 1, as well as a $K_2SiF_6$ crystal.

FIG. 2 shows XPS spectra of Mn2p2/3 according to Examples 1 to 3 and Comparative Examples 1 and 2.

FIG. 3 shows XPS spectra of F1s according to Examples 1 to 3 and Comparative Examples 1 and 2.

FIG. 4 shows excitation and fluorescence spectra measured in evaluation of light emitting properties.

DESCRIPTION OF THE PREFERRED EMBODIMENTS

Hereinafter, embodiments of the present invention will be described in detail. However, the present invention is not limited to the following embodiments, and various modifications can be made within the spirit of the present invention. Also, in the present specification, an upper limit and a lower limit are inclusive when describing a numerical range, unless otherwise specified.

A fluoride phosphor according to the present invention has a composition represented by the following general formula (1):

$$A_2SiF_6{:}Mn^{4+} \qquad (1)$$

in which:

A represents at least one alkali metal comprising at least K (potassium), Si represents silicon, F represents fluorine, and Mn represents manganese.

Further, in the general formula (1), "$A_2SiF_6$" represents a composition of a matrix crystal of the phosphor, and "$Mn^{4+}$" represents an activating element as a luminescent center.

That is, the fluoride phosphor according to the present invention means that the matrix crystal is a fluoride and the activating element is manganese. The presence of manganese as a tetravalent cation ($Mn^{4+}$) can provide not only a sharp emission spectrum, but also improve light emitting properties. The manganese that is an activating element is preferably introduced at a silicon site of the mother crystal.

A specific example of A is K alone, or a combination of K and an alkali metal element selected from the group consisting of Li (lithium), Na (sodium), Rb (rubidium) and Cs (cesium). Among them, A is preferably K alone in terms of chemical stability.

Further, the fluoride phosphor according to the present invention may be a single fluoride phosphor, but it may be a mixture of two or more fluoride phosphors having different compositions. In the case of the mixture of two or more fluoride phosphors, a ratio of K to the total amount of A in the mixture is preferably high, in terms of chemical stability.

In the fluoride phosphor, $Mn^{4+}$ acts as a non-luminescent light absorbing factor and causes both absorption of excitation light and suppression of fluorescence when $Mn^{4+}$ is bonded to an element other than fluorine, specifically to oxygen. As a result, light emitting properties of the fluoride phosphor may not be sufficiently improved. Therefore, it is believed that it is ideal to make an amount of $Mn^{4+}$ bonded to oxygen closer to zero.

However, when an amount of $Mn^{4+}$ bonded to oxygen is reduced, an amount of $Mn^{4+}$ contributing to light emission is decreased accordingly, so that light emitting properties (e.g., an external quantum efficiency) tend to be decreased.

Therefore, to improve the light emitting properties of the fluoride phosphor, the amount of $Mn^{4+}$ bonded to oxygen should be controlled in a well-balanced way, taking the above points into account.

Further, since the amount of $Mn^{4+}$ bonded to fluorine varies depending on an amount of manganese activated in the fluoride phosphor, the amount of $Mn^{4+}$ bonded to fluorine should be controlled, taking the amount of manganese activated into account. In the fluoride phosphor, manganese is introduced at the silicon site of the matrix crystal, and the amount of fluorine is not almost changed before and after the activation. Therefore, in the present invention, evaluation taking the amount of manganese activated in to account can be performed by evaluating the amount of $Mn^{4+}$ bonded to oxygen, based on the amount of fluorine (that is, the total amount of the amount of fluorine bonded to silicon and the amount of fluorine bonded to $Mn^{4+}$).

The amount of $Mn^{4+}$ bonded to oxygen, as well as the total amount of the amount of fluorine bonded to silicon and the amount of fluorine bonded to $Mn^{4+}$ can be easily calculated from areas of the spectra obtained by XPS measurement of the fluoride phosphor.

The amount of $Mn^{4+}$ bonded to oxygen can be obtained from an area (A1) of a spectrum in a range of from 637 eV or more to less than 645 eV in XPS measurement of the fluoride phosphor (for example, see Patent Document 1).

Further, the total amount of the amount of fluorine bonded to silicon and the amount of fluorine bonded to $Mn^{4+}$ can be obtained from an area (A2) of a spectrum in a range of from 682.8 eV or more to less than 690 eV in XPS measurement of the fluoride phosphor (for example, see M. C. Peignon et. al., "X-ray photoelectron study of the reactive ion etching of $Si_xGe_{1-x}$ alloys in $SF_6$ plasma", Journal of Vacuum Science & Technology A, 1996, Vol. 14, No. 1, pp. 156-164).

Therefore, in the fluoride phosphor according the present invention, a ratio (A1/A2) of the area (A1) of the spectrum in the range of from 637 eV or more to less than 645 eV in the XPS measurement to the area (A2) of the spectrum in the range of from 682.8 eV or more to less than 690 eV in the XPS measurement is controlled to 0.0008 to 0.0025, and preferably 0.0010 to 0.0020. The ratio A1/A2 in the above range can provide a fluoride phosphor that has improved light emitting properties and can improve luminance when used for the white LEDs. However, if the area ratio A1/A2 is higher, then the proportion of $Mn^{4+}$ bonded to oxygen will be too high, so that the light emitting properties of the fluoride phosphor tend not to be sufficiently improved. Specifically, if the area ratio A1/A2 exceeds 0.0025, then the external quantum efficiency will be decreased. Further, if the area ratio A1/A2 is less than 0.0008, then the proportion of $Mn^{4+}$ bonded to oxygen will be too low, so that the proportion of $Mn^{4+}$ bonded to fluorine will be also decreased. As a result, regions that do not contribute to light emission are increased, leading to a decreased external quantum efficiency.

XPS Measurement

The XPS measurement of the fluoride phosphor can be carried out using an X-ray photoelectron spectrometer (VersaProbe II available from ULVAC-PHI Inc.).
Measurement conditions are as follows:
X-ray source: Al-Kα;
Output: 15 kV-50 W;
Charge neutralization: electron/Ar ion;
Measurement area: 200 μm φ spot;
Take-off angle: 45° from surface;
Narrow scan spectrum (C1s, F1s, Mn2p2/3);
Path energy: 46.950 eV; and
Step size: 0.05 eV.

Method of Calculating A1, A2 and A1/A2

(Method of Calculating A1)
Signal intensities at 637±0.25 eV is averaged, and the average value is defined as a signal intensity at 637 eV. Signal intensities at 645±0.25 eV is then averaged, and the average value is defined as a signal intensity at 645 eV. A straight line is then drawn between 637 eV and 645 eV to define background, and the background between 637 and 645 eV is subtracted. The spectral area (A1) in the range of from 637 eV or more to less than 645 eV is then calculated.

(Method of Calculating A2)
Signal intensities at 682.8±0.25 eV are averaged, and the average value is defined as a signal intensity at 682.8 eV. Signal intensities at 690±0.25 eV are averaged, and the average value is defined as a signal intensity at 690 eV. A straight line is then drawn between 682.8 eV and 690 eV to define background, and the background between 682.8 and 690 eV is subtracted. The spectral area (A2) in the range of from 682.8 eV or more to less than 690 eV is then calculated.

(Method of Calculating A1/A2)
The area ratio (A1/A2) is calculated by dividing A1 by A2.

The fluoride phosphor having the features as stated above according to the present invention can be produced by preparing a fluoride phosphor and then subjecting the fluoride phosphor to a treatment for reducing an amount $Mn^{4+}$ bound to oxygen (for example, a washing treatment).

The method for preparing the fluoride phosphor is not particularly limited, and a method known in the art can be used. Specifically, a compound that will form a matrix crystal of the fluoride phosphor and a compound containing $Mn^{4+}$ as a luminescent center may be dissolved in hydrofluoric acid to react them. As an alternative method, an elemental metal such as silicon may be immersed in a mixed solution of hydrofluoric acid and potassium permanganate, or the like.

The washing treatment requires adjustment depending on the types of the fluoride phosphors and the methods for preparing those phosphors, and it is thus difficult to unequivocally define the washing treatment. However, for example, the washing treatment may be carried out using a redox agent or the like. More particularly, the fluoride phosphor may be washed with hydrofluoric acid containing a hydrogen peroxide solution (a hydrogen peroxide concentration of 1% by mass; a hydrogen fluoride concentration of 20% by mass), and then washed with methanol. Alternatively, the fluoride phosphor may be washed several times (for example, six times) with hydrofluoric acid (a hydrogen fluoride concentration of 20% by mass), and then further washed with methanol.

The fluoride phosphor according to the present invention thus produced has improved light emitting properties and improved durability, because the amount of $Mn^{4+}$ bonded to fluorine present on the outermost surface is controlled by a well-balanced way.

The light emitting device according to the present invention includes the fluoride phosphor as described above and a light emitting source having a peak wavelength of 420 nm to 480 nm. Since the light emitting device includes the fluoride phosphor which has improved light emitting properties and can provide improved luminance when used for the white LEDs, the light emitting device has improved light emitting properties and improved luminance. The peak wavelength of the light emitting source of 420 nm to 480 nm can allow efficient excitation of $Mn^{4+}$ which is the luminescent center of the fluoride phosphor, and can be also used as blue light for the light emitting device.

The light emitting device according to the present invention may further include a phosphor that emits green light having a peak wavelength of 510 nm to 550 nm (hereinafter, referred to as a "green phosphor") when receiving excitation light having a wavelength of 455 nm. The green phosphor may be of a single type, but may be of two or more types. The light emitting device according to the present invention including such a configuration can provide white light due to a combination of the fluoride phosphor emitting red light, the light emitting device emitting blue light, and the green phosphor emitting green light, and can also provide light emission having various color gamut by changing a mixing ratio of these three colors. In particular, the use of a β-sialon phosphor activated by Eu, which has an emission spectrum with a narrower half-value width, as the green phosphor, can provide a light emitting device having wider color gamut, which is preferable.

EXAMPLES

Hereinafter, the present invention will be more specifically described with reference to Examples and Comparative Examples, but the present invention is not limited to the following Examples without departing from the spirit of the present invention.

Preparation of $K_2MnF_6$ $K_2MnF_6$ was prepared according to the method described in Non-Patent Document 1. More particularly, 800 mL of hydrofluoric acid (a hydrogen fluoride concentration of 40% by mass) was placed in a 2,000 mL fluororesin beaker, and 260.0 g of potassium hydrogenfluoride powder (a special grade reagent available from Wako Pure Chemical Corporation) and 12.0 g of potassium permanganate powder (a first grade reagent available from Wako Pure Chemical Corporation) was dissolved therein. 8 mL of a hydrogen peroxide solution (a hydrogen peroxide concentration of 30% by mass, a special grade reagent available from KANTO KAGAKU) was gradually dropped to the solution of hydrofluoric acid while stirring it with a magnetic stirrer. When the amount of the hydrogen peroxide solution dropped exceeded a certain amount, yellow powder began to precipitate and the color of the reaction solution began to change from purple. After dropping a certain amount of the hydrogen peroxide solution, stirring was continued for a period of time, and stirring was then stopped to settle out the precipitated powder. The resulting supernatant was removed, methanol was added, the mixture was stirred and allowed to stand, and the resulting supernatant was then removed and methanol was further added. This procedure was repeated until the solution became neutral. The resulting precipitated powder was then recovered by filtration, and methanol was completely removed by evaporating and drying the recovered powder to obtain 19.0 g of $K_2MnF_6$ powder. All these procedures were performed at room temperature.

Example 1

At normal temperature, 210 mL of hydrofluoric acid (a hydrogen fluoride concentration of 55% by mass) was placed in a 500 mL fluororesin beaker, and 26.3 g of potassium hydrogenfluoride powder (a special grade reagent available from Wako Pure Chemical Corporation) and 1.2 g of $K_2MnF_6$ powder were sequentially dissolved therein to prepare an aqueous solution. To the aqueous solution was then added 7.2 g of silicon dioxide (FB-50R, available from Denka Company Limited). As the silicon dioxide powder was added to the aqueous solution, the temperature of the aqueous solution was increased due to generation of heat of dissolution. The temperature of the aqueous solution reached the maximum temperature after about 3 minutes of the addition of silicon dioxide, and the temperature of the aqueous solution was then decreased because dissolution of the silicon dioxide was completed. In addition, it was visually observed that yellow powder began to be produced in the aqueous solution immediately after adding the silicon dioxide powder.

After the silicon dioxide powder was completely dissolved, the aqueous solution was continuously stirred for a period of time to completely precipitate yellow powder. The aqueous solution was then allowed to stand to settle out the yellow powder. Subsequently, the resulting supernatant was removed, and the yellow powder was washed with hydrofluoric acid containing a hydrogen peroxide solution (a hydrogen peroxide concentration of 1% by mass and a hydrogen fluoride concentration of 20% by mass) and methanol, and yellow powder was then separated by filtration and recovered. The yellow powder was dried to remove residual methanol by evaporation. Subsequently, using a nylon sieve having an opening of 75 μm, only yellow powder that passed through the sieve was classified and recovered to obtain a fluoride phosphor of Example 1.

Example 2

At normal temperature, 210 mL of hydrofluoric acid (a hydrogen fluoride concentration of 55% by mass) was placed in a 500 mL fluororesin beaker, and 26.3 g of potassium hydrogenfluoride powder (a special grade reagent available from Wako Pure Chemical Corporation) was dissolved therein to prepare an aqueous solution. 7.2 g of silicon dioxide (FB-50R, available from Denka Company Limited) and 1.2 g of $K_2MnF_6$ powder were simultaneously added to the aqueous solution with stirring. As these powders were added to the aqueous solution, the temperature of the aqueous solution was increased due to heat of dissolution of silicon dioxide. The temperature of the aqueous solution reached the maximum temperature (about 40° C.) after about 3 minutes of the addition of the powders, and the temperature of the aqueous solution was then decreased because dissolution of silicon dioxide was completed.

After the silicon dioxide powder was completely dissolved, the aqueous solution was continuously stirred for a period of time to completely precipitate yellow powder. The aqueous solution was then allowed to stand to settle out the yellow powder. Subsequently, the resulting supernatant was removed, and the yellow powder was washed with hydrofluoric acid containing a hydrogen peroxide solution (a hydrogen peroxide concentration of 1% by mass and a hydrogen fluoride concentration of 20% by mass) and methanol, and the yellow powder was then separated by filtration and recovered. The yellow powder was dried to remove residual methanol by evaporation. Subsequently, using a nylon sieve having an opening of 75 μm, only yellow powder that passed through the sieve was classified and recovered to obtain a fluoride phosphor of Example 2.

Example 3

At normal temperature, 210 mL of hydrofluoric acid (a hydrogen fluoride concentration of 55% by mass) was placed in a 500 mL fluororesin beaker, and 26.3 g of potassium hydrogenfluoride powder (a special grade reagent available from Wako Pure Chemical Corporation) was dissolved therein to prepare an aqueous solution. 7.2 g of silicon dioxide (FB-50R, available from Denka Company Limited) and 1.2 g of $K_2MnF_6$ powder were simultaneously added to the aqueous solution with stirring. As these powders were added to the aqueous solution, the temperature of the aqueous solution was increased due to heat of dissolution of silicon dioxide. The temperature of the aqueous solution reached the maximum temperature (about 40° C.) after about 3 minutes of the addition of the powders, and the temperature of the aqueous solution was then decreased because dissolution of silicon dioxide was completed.

After the silicon dioxide powder was completely dissolved, the aqueous solution was continuously stirred for a period of time to completely precipitate yellow powder. The aqueous solution was then allowed to stand to settle out the yellow powder. Subsequently, the resulting supernatant was removed, and the yellow powder was washed six times with hydrofluoric acid (a hydrogen fluoride concentration of 20% by mass), and the yellow powder was then washed with methanol. The yellow powder was then separated by filtration and recovered, and the yellow powder was then dried to remove residual methanol by evaporation. Subsequently, using a nylon sieve having an opening of 75 μm, only yellow powder that passed through the sieve was classified and recovered to obtain a fluoride phosphor of Example 3.

Comparative Example 1

At normal temperature, 210 mL of hydrofluoric acid (a hydrogen fluoride concentration of 55% by mass) was placed in a 500 mL fluororesin beaker, and 26.3 g of potassium hydrogenfluoride powder (a special grade reagent available from Wako Pure Chemical Corporation) and 1.2 g of $K_2MnF_6$ powder were sequentially dissolved therein to prepare an aqueous solution. To the aqueous solution was then added 7.2 g of silicon dioxide (FB-50R, available from Denka Company Limited). It was visually observed that yellow powder began to be produced in the aqueous solution immediately after adding the silicon dioxide powder.

After the silicon dioxide powder was completely dissolved, the aqueous solution was continuously stirred for a period of time to completely precipitate yellow powder. The aqueous solution was then allowed to stand to settle out the yellow powder. Subsequently, the resulting supernatant was removed, and the yellow powder was washed with methanol, and yellow powder was then separated by filtration and recovered. The yellow powder was then dried to remove residual methanol by evaporation. Subsequently, using a nylon sieve having an opening of 75 μm, only yellow powder that passed through the sieve was classified and recovered to obtain a fluoride phosphor of Comparative Example 1.

Comparative Example 2

The fluoride phosphor of Comparative Example 1 was heated in air at 400° C. for 12 hours to obtain a fluoride phosphor of Comparative Example 2.

Evaluation of Crystal Phase

The crystal phases were evaluated for the fluoride phosphors of Examples and Comparative Examples as well as a $K_2SiF_6$ crystal by measuring X-ray diffraction patterns using an X-ray diffractometer (Ultima IV available from Rigaku Corporation, using a CuKα tube).

As a result, all the fluoride phosphors of Examples and Comparative Examples as described above showed the same X-ray diffraction pattern. Further, the X-ray diffraction pattern of the fluoride phosphors was the same as that of the $K_2SiF_6$ crystal. Therefore, it was confirmed that each of the fluoride phosphors of Examples and Comparative Examples as stated above had a crystal phase represented by $K_2SiF_6$:$Mn^{4+}$ as a single phase. As representative examples, the X-ray diffraction patterns of the fluoride phosphors of Example 1 and Comparative Example 1 as well as the $K_2SiF_6$ crystal are shown in FIG. 1.

XPS Measurement

XPS spectra of the fluoride phosphors of Examples and Comparative Examples as described above were measured using an X-ray photoelectron spectrometer (VersaProbe II available from ULVAC-PHI Inc.). The measurement conditions were as described above.

The XPS spectra of Mn2p2/3 and F1s are shown in FIGS. 2 and 3, respectively. It should be noted that the XPS spectra in FIGS. 2 and 3 are normalized such that the maximum value is 1. It should be also noted that the XPS spectra of FIGS. 2 and 3 have different S/N ratios, because the amount of Mn contained in the fluoride phosphors is very lower than the amount of F.

From each XPS spectrum of Mn2p2/3 in FIG. 2, the area (A1) of the spectrum in the range of from 637 eV or more to less than 645 eV was calculated according to the above procedures. Further, from each XPS spectrum of F1s in FIG. 3, the area (A2) of the spectrum in the range of from 682.8 eV or more to less than 690 eV was calculated according to the above procedures. The area ratio (A1/A2) was then calculated by dividing A1 by A2. Calculation results of A1, A2 and A1/A2 are shown in Table 1.

TABLE 1

|  | A1 | A2 | A1/A2 |
| --- | --- | --- | --- |
| Example 1 | 132 | 70012 | 0.0019 |
| Example 2 | 112 | 69754 | 0.0016 |
| Example 3 | 156 | 71162 | 0.0022 |
| Comparative Example 1 | 259 | 78652 | 0.0033 |
| Comparative Example 2 | 26 | 65320 | 0.0004 |

As shown in Table 1, each of the fluoride phosphors of Examples 1 to 3 had an area ratio A1/A2 in a range of from 0.0008 to 0.0025, whereas each of the fluoride phosphors of Comparative Examples 1 and 2 had an area ratio A1/A2 which was beyond the above range. The fluoride phosphor of Comparative Example 1 had an area ratio A1/A2 of more than 0.0025, indicating that the amount of $Mn^{4+}$ bonded to oxygen was too high. Further, the fluoride phosphor of Comparative Example 2 had an area ratio A1/A2 of less than 0.0008, indicating that the amount of $Mn^{4+}$ bonded to oxygen was too low, whereby the proportion of $Mn^{4+}$ bonded to fluorine was also decreased.

Evaluation of Light Emitting Properties

For each of the fluoride phosphors of Examples and Comparative Examples as described above, the light emitting properties were evaluated by measuring a rate of absorption, an internal quantum efficiency and an external quantum efficiency. The measurements were carried out as follows:

First, a standard reflector (Spectralon, available from Labsphere) having a reflectance of 99% was set to a side opening (φ10 mm) of an integrating sphere (φ60 mm). Monochromatic light separated into a wavelength of 455 nm from a light emitting source (a Xe lamp) was introduced into the integrating sphere through an optical fiber, and a spectrum of reflected light was measured with a spectrophotometer (MCPD-7000, available from OTSUKA ELECTRONICS Co., Ltd.). In this case, a number of photons of excitation light ($Q_{ex}$) was calculated from the spectrum having a wavelength range of from 450 to 465 nm. A concave cell filled with each fluoride phosphor such that the surface of the cell became smooth was set into the opening of the integrating sphere, the cell was then irradiated with monochromatic light having a wavelength of 455 nm, and spectra of reflected light of excitation and fluorescence were measured with a spectrophotometer. The excitation and fluorescence spectra obtained by the measurement are shown in FIG. 4. The number of photons ($Q_{ref}$) of reflected light of excitation and the number of fluorescent photons ($Q_{em}$) were calculated from the spectral data obtained by the measurement. The number of photons of reflected light of excitation was calculated in the same wavelength range as that of the number of photons of excitation light, and the number of fluorescent photons was calculated in a range of from 465 to 800 nm. The external quantum efficiency ($=Q_{em}/Q_{ex} \times 100$), the rate of absorption ($=(Q_{ex}-Q_{ref}) \times 100$), and the internal quantum efficiency ($=Q_{em}/(Q_{ex}-Q_{ref}) \times 100$) were calculated from the resulting three numbers of photons. The results of the rate of absorption, internal quantum efficiency and external quantum efficiency are shown in Table 2.

TABLE 2

|  | Rate of Absorption | Internal Quantum Efficiency | External Quantum Efficiency |
| --- | --- | --- | --- |
| Example 1 | 64 | 87 | 56 |
| Example 2 | 67 | 85 | 57 |
| Example 3 | 66 | 87 | 57 |
| Comparative Example 1 | 78 | 51 | 40 |
| Comparative Example 2 | 61 | 67 | 41 |

As can be seen from Table 2, each fluoride phosphor of Examples 1 to 3 having the area ratio A1/A2 in the range of from 0.0008 to 0.0025 exhibited a higher internal quantum efficiency and a higher external quantum efficiency, and hence improved light emitting properties, as compared with the fluoride phosphors of Comparative Examples 1 and 2 in which the area ratio A1/A2 was beyond such a range. In addition, it can be judged that when the external quantum efficiency is 50% or more, optical properties are good. These results would be due to the fact that in the fluoride phosphor of each of Examples 1 to 3, any inhibition of light emission of the fluoride phosphor was suppressed by decreasing colored compounds caused by $Mn^{4+}$ bonded to oxygen.

Evaluation of Luminance

Each fluoride phosphor of Examples and Comparative Examples as stated above was added to a silicone resin together with a β-sialon green phosphor (GR-MW 540 K, available from Denka Company Limited; a peak emission wavelength of 540 nm upon receiving excitation light having a wavelength of 455 nm), and the mixture was degassed and kneaded. The mixture was then potted onto a surface-implementing type package to which a blue LED element having a peak wavelength of 450 nm was bonded, and the mixture was further thermally cured to prepare a white LED. A ratio of amounts of the fluoride phosphor and the β-sialon green phosphor to be added was adjusted such that chromaticity coordinates (x, y) of the white LED were (0.28, 0.27) at the time of light emission due to electric conduction.

The chromaticity at the time when the resulting white LED was energized to emit light was measured by a total luminous flux measuring device available from OTSUKA ELECTRONICS Co., Ltd. (a device in which an integrating hemisphere having a diameter of 300 mm and a spectrophotometer/MCPD-9800 were combined). Ten samples of the resulting white LEDs having a chromaticity x ranging from 0.275 to 0.284 and a chromaticity y ranging from 0.265 to 0.274 were picked up, and an average value of the total luminous flux when the samples were energized to emit light was determined. The evaluation results were relative evaluations in the case where the average value of the total luminous flux of the white LED prepared using the fluoride phosphor of Comparative Example was defined as 100%. The results are shown in Table 3.

TABLE 3

| | Total Luminous Flux (%) |
|---|---|
| Example 1 | 101 |
| Example 2 | 102 |
| Example 3 | 100 |
| Comparative Example 1 | 95 |
| Comparative Example 2 | 91 |

As shown in Table 3, it was confirmed that the white LEDs produced using the fluoride phosphors of Examples 1 to 3 each having the area ratio A1/A2 in the range of from 0.0008 to 0.0025 had higher luminance than the white LEDs produced using the fluoride phosphors of Comparative Examples 1 and 2 each having the area ratio A1/A2 which was beyond the above range.

As can be seen from the above results, according to the present invention, it is possible to provide a fluoride phosphor which has improved light emitting properties and can provide improved luminance when used for the white LEDs. Further, according to the present invention, it is possible to provide a light emitting device having improved light emitting properties and improved luminance.

INDUSTRIAL APPLICABILITY

The fluoride phosphor according to the present invention is suitable as a red phosphor for white LEDs using a blue light as a light source, and can be suitably used for light emitting devices such as lighting devices and image display devices.

What is claimed is:

1. A fluoride phosphor, the fluoride phosphor having a composition represented by the general formula (1):

$$A_2SiF_6:Mn^{4+} \tag{1}$$

in which A represents at least one alkali metal comprising at least K; and the fluoride phosphor having a ratio (A1/A2) of an area (A1) of a spectrum in a range of from 637 eV or more to less than 645 eV in XPS measurement to an area (A2) of a spectrum in a range of from 682.8 eV or more to less than 690 eV in XPS measurement, of 0.0008 to 0.0025.

2. The fluoride phosphor according to claim 1, wherein A is K alone.

3. A light emitting device comprising: the fluoride phosphor according to claim 1; and a light emitting source having a peak wavelength of 420 nm to 480 nm.

4. A light emitting device comprising: the fluoride phosphor according to claim 2; and a light emitting source having a peak wavelength of 420 nm to 480 nm.

5. The light emitting device according to claim 3, wherein the light emitting device further comprises at least one phosphor that emits green light having a peak wavelength of 510 nm to 550 nm when receiving excitation light having a wavelength of 455 nm.

6. The light emitting device according to claim 4, wherein the light emitting device further comprises at least one phosphor that emits green light having a peak wavelength of 510 nm to 550 nm when receiving excitation light having a wavelength of 455 nm.

7. The light emitting device according to claim 5, wherein the at least one phosphor that emits green light comprises a β-sialon phosphor activated by Eu.

8. The light emitting device according to claim 6, wherein the at least one phosphor that emits green light comprises a β-sialon phosphor activated by Eu.

* * * * *